United States Patent
Chen et al.

(10) Patent No.: US 8,291,156 B2
(45) Date of Patent: Oct. 16, 2012

(54) MEMORY SYSTEM HAVING HYBRID DENSITY MEMORY AND METHODS FOR WEAR-LEVELING MANAGEMENT AND FILE DISTRIBUTION MANAGEMENT THEREOF

(75) Inventors: Ming-Dar Chen, Hsinchu (TW); Chuan-Sheng Lin, Hsinchu County (TW); Hui-Neng Chang, Taoyuan County (TW); Hsiang-An Hsieh, Taipei (TW)

(73) Assignee: A-Data Technology Co., Ltd., Taipei (TW)

( * ) Notice: Subject to any disclaimer, the term of this patent is extended or adjusted under 35 U.S.C. 154(b) by 0 days.

(21) Appl. No.: 13/159,784

(22) Filed: Jun. 14, 2011

(65) Prior Publication Data
US 2011/0246709 A1    Oct. 6, 2011

Related U.S. Application Data

(62) Division of application No. 12/050,567, filed on Mar. 18, 2008, now Pat. No. 8,015,346.

(51) Int. Cl.
*G06F 12/02* (2006.01)

(52) U.S. Cl. .................. 711/103; 365/185.03; 711/165; 711/E12.008

(58) Field of Classification Search .................. 711/103, 711/165, 167, E12.008
See application file for complete search history.

(56) References Cited

U.S. PATENT DOCUMENTS

| | | | |
|---|---|---|---|
| 6,081,447 A | 6/2000 | Lofgren et al. | |
| 6,230,233 B1 | 5/2001 | Lofgren et al. | |
| 6,594,183 B1 | 7/2003 | Lofgren et al. | |
| 6,807,106 B2 | 10/2004 | Gonzales et al. | |
| 6,831,865 B2 | 12/2004 | Chang et al. | |
| 6,850,443 B2 | 2/2005 | Lofgren et al. | |
| 6,985,992 B1 | 1/2006 | Chang et al. | |
| 7,948,798 B1 * | 5/2011 | Sheredy et al. | 365/185.03 |
| 2002/0184432 A1 * | 12/2002 | Ban | 711/102 |
| 2006/0265545 A1 * | 11/2006 | Entani | 711/103 |
| 2007/0061502 A1 * | 3/2007 | Lasser et al. | 711/103 |
| 2008/0198651 A1 * | 8/2008 | Kim | 365/185.03 |
| 2009/0172255 A1 * | 7/2009 | Yeh et al. | 711/103 |

* cited by examiner

*Primary Examiner* — Charles Rones
*Assistant Examiner* — Nathan N Sadler
(74) *Attorney, Agent, or Firm* — Rosenberg, Klein & Lee

(57) ABSTRACT

The present invention discloses a memory system having a hybrid density memory. The memory system includes a plurality of storage spaces whereby the storage spaces have respective levels of endurance and each storage space has a plurality of blocks and pre-determined weighting factors corresponding to the levels of endurance of the storage spaces. After executing a command of erasing a specific block, the system records the erase in accordance with the weighting factor of the storage space to which the specific block belongs. Whereby, the erase counts of all the blocks of different storage spaces are able to reach respective levels of endurance as simultaneously as possible.

3 Claims, 6 Drawing Sheets

|   32   |       |
|--------|-------|
| Block L₁ | C_{L1} |
| Block L₂ | C_{L2} |
| Block L₃ | C_{L3} |
| ⋮ | |
| Block L_M | C_{LM} |

|   34   |       |
|--------|-------|
| Block H₁ | C_{H1} |
| Block H₂ | C_{H2} |
| Block H₃ | C_{H3} |
| ⋮ | |
| Block H_N | C_{HN} |

FIG. 4

MEMORY SYSTEM HAVING HYBRID DENSITY MEMORY AND METHODS FOR WEAR-LEVELING MANAGEMENT AND FILE DISTRIBUTION MANAGEMENT THEREOF

RELATED APPLICATIONS

This application is a Divisional patent application of application Ser. No. 12/050,567, filed on 18 Mar. 2008, now U.S. Pat. No. 8,015,346. The entire disclosure of the prior application Ser. No. 12/050,567, from which an oath or declaration is supplied, is considered a part of the disclosure of the accompanying Divisional application and is hereby incorporated by reference.

BACKGROUND OF THE INVENTION

1. Field of the Invention

The present invention relates to a memory system; in particular, to a memory system having a hybrid density memory, and methods for wear-leveling management and file distribution management thereof.

2. Description of Related Art

As technologies advance, demand for data storage capacity increases incessantly. Among the non-volatile memories (or referred as electricity-independent memory) used for data storage, flash memory presents advantages of high storage density, low power consumption, effective access efficiency and reasonable price, thus becoming the most commonly adopted storage media nowadays. Flash memory with tight and rigid structure is suitable for being installed within electric devices, including digital camera, digital cam, digital music player, hand-held personal computer and GPS etc, or may be fabricated as storage device like memory card and thumb drive.

Although flash memory provides many advantages, there exist two restrictions in hardware. First, flash memory is read and programmed to operate in the unit of pages and erased in the unit of blocks. A block of flash memory, before re-writing data therein, must be erased in advance to perform re-write, and direct overwrite is not possible. Second, since the erase action must be performed under higher voltage, the erase count that flash memory can endure is limited. The limit on memory erase count is generally referred as the memory endurance cycle. As the accumulated erase count of a block approaches to the erase count limit, it is probable to result in write failure, reducing the data access reliability. Therefore, wear-leveling technology has been developed for controlling the data storage in flash memory, which allows the erase counts of all memory blocks in memory to be consistent as much as possible, enabling effective usage of all blocks in memory.

The memory records the stored bit values by voltage values conserved in memory cells. In traditional memory storage technology, a bit data as one (1) or zero (0) is record by means of high level or zero level of the voltage value conserved in one memory cell. As semi-conductor manufacture technology develops, the level values conserved within memory cell can be further divided, so as to store more bit data. For example, if a memory cell can retain four different level values, it is possible to store two-bit data; in case that a memory cell can conserve sixteen different level values, then it can store four-bit data. The industry refers the traditional memory manufacture technology for storing one single bit data as the Single-Level-Cell (SLC) process, and memory manufacture technology for storing multi-bit data as the Multi-Level-Cell (MLC) process; memory fabricated by adopting the SLC process as low density memory, and memory fabricated through the MLC process as high density memory.

Compared with low density memory, the data storage capacity provided within a unit area of high density memory increases multifold. Since high density memory provides desirable advantages in terms of price and storage capacity, the current memory card and thumb drive hence commonly adopt high density memory as data storage. Although MLC process creates high storage capacity of high density memory, the storage features thereof nonetheless comparatively deteriorate, in which the main defects comprise significant reductions in erase endurance and access rate. The erase endurance of memory closely relates to the employed manufacture technology. Currently, the erase endurance of low density memory available in market is about 100,000 times, whereas the erase endurance for high density memory generally 10,000 times, showing a difference by a factor of 10. Based on this reason, while the industry employs high density memory to significantly increase the storage capacity of storage devices, the serious defect of dramatic shrinkage in life span also emerges.

In view that the advantages of high density memory lie in high storage capacity and low cost, and advantages of low density memory exist in high erase endurance and fast access rate, each type of memory respectively demonstrates features thereof, the industry therefore has developed in recent years a hybrid density memory. As can be appreciated from its name, said hybrid density memory is configured with both high density memory and low density memory. As for exploiting advantages provided by both types of memory to optimize the performance of hybrid density memory has now become one major research subject aggressively devoted by relevant industry.

U.S. Pat. No. 6,807,106 (referred hereunder as the '106) proposed a data storage technology for hybrid density memory. Referring now to FIGS. 1A and 1B, these Figures illustrate a diagram of storage management for hybrid density memory proposed by the '106. FIGS. 1A and 1B depict a corresponding conversion relationship between logical positions and physical positions of file data storage; that is, the relationship between the address space of a data and a physically stored memory position thereof. As shown in FIG. 1A, the logical block 10 consists of a header area 100 and a data area 105. The data area 105 contains the actual contents of the data, and the header area 100 is used for relevant control information, e.g., information for describing the correctness or other attributes of the data in the data area 105. FIG. 1B shows distribution of the physical block 12 to which the logical block 10 in FIG. 1A corresponds. As illustrated in FIG. 1B, the header area 100 and data area 105 of the logical block 10 are respectively distributed to a low density memory block 120 and a high density memory block 125. The '106 is directed to frequent access of the data stored in the header area 100, hence the data of the header area 100 is stored in the low density memory block 120 for faster access rate, and the data area 105 occupying more space is stored in the high density memory block 125, so as to enhance the data access performance of hybrid density memory. Although the technical solution proposed by the '106 is able to enhance the access performance of file data stored inside hybrid density memory, the technology did not meet the requirement on wear-leveling of block, thus the life span of the storage device is restricted by the high density memory with less erase endurance. In the '106, once the file data is updated, the header area 100 and the data in the data area 105 will be updated together and, collaterally, one erase action must be also performed onto both the low density memory block 120 as well as the high density memory block 125. Referring to FIG. 2, a diagram of erase count for the '106 is shown. In FIG. 2, block positions $L_1$ and $H_1$ respectively illustrate the erase counts of the low density memory block 120 and the high density memory block 125. The erase endurance counts for the low density memory block and the high density memory block are individually referred as EC2 and EC1. Though hybrid density memory storage is composed of multiple high density memory blocks and multiple low density memory blocks, herein a single high density memory block and a single low density memory block are used to explain the reason why the '106 did not meet the requirement on wear-leveling.

As shown in FIG. 2, when the storage device is in use, the erase counts of the block positions $L_1$ and $H_1$ increase at the same time; as the accumulated erase counts for both of them reach the erase endurance count EC1 of the high density memory block, the high density memory block may be disabled to perform the function of data storage. Collaterally, since the erase count in the high density memory block has reached its limit, the storage device may fail. However, upon the failure of the storage device, the erase count in the low density memory block has not yet reached its endurance count EC2. Besides, taking the endurance counts EC2 and EC1 as respectively 100,000 and 10,000 times for example, the erase count in the low density memory block has merely reached 10 percents of the endurance count thereof, which wastes the reset 90 percents of available storage resources. Obviously, the technology proposed in the '106 did not meet the requirement on wear-leveling, resulting in wastes of memory resources.

U.S. Pat. Nos. 6,081,447, 6,230,233, 6,594,183, 6,831,865, 6,850,443, 6,985,992 proposed several wear-leveling technologies, but none provided practical solutions for wear-leveling directed to hybrid density memory. Regarding the aforementioned issues, the inventors thus propose the present invention, expecting to fully exploit and optimize the storage resource usage of hybrid density memory.

SUMMARY OF THE INVENTION

In view of the above-stated issues, one objective of the present invention is to provide a memory system having hybrid density memory, which records an erase count based on a weighting factor which corresponds to the memory storage space to which the block belongs, so as to allow the blocks respectively belonging to different memory storage spaces to be able to reach the limits of endurance counts as simultaneously as possible.

Another objective of the present invention is to provide a method of wear-leveling management for hybrid density memory, which generates a sampling table based on the endurance counts of the memory storage spaces to determine the block positions, so as to allow the blocks respectively belonging to different memory storage spaces to be able to reach the limits of endurance counts as simultaneously as possible.

Yet another objective of the present invention is to provide a method of file distribution management, which, through referring to a reference table for determining the blocks that a file uses, it may distribute the file to the adequate memory storage space for storage, thus exploiting the performance of hybrid density memory.

The present invention discloses a memory system having hybrid density memory. Said memory system comprises a plurality of memory storage spaces having different endurance counts and plural blocks, as well as the prescribed weighting factors corresponding to the memory storage spaces and endurance counts thereof. After erasing data on a specific block by the system, it records said erasing based on the weighting factor which corresponds to the memory storage space to which the block belongs.

The present invention further discloses a method of wear-leveling management for hybrid density memory, which is suitable for controlling a memory system. Said memory system comprises a plurality of memory storage spaces, in which the memory storage spaces respectively have different endurance counts, and each of memory storage space consists of a plurality of blocks. The steps of said method of wear-leveling management are, initially, to receive a data storage command. Next, based on the ratio of endurance counts for the memory blocks, it generates a sampling table in response to the command, wherein the sampling table is composed of a plurality of block positions corresponding to the endurance counts. Finally, it selects at least one block position contained in the sampling table, so as to store the data in accordance the data storage command based on the selected block position.

The present invention further discloses a method of file distribution management for hybrid density memory, which is suitable for file distribution in a memory system. Said memory system comprises a plurality of memory storage spaces, in which the memory storage spaces respectively have different endurance counts, and the steps for said method of file distribution management are, initially, to receive a command for performing a storage distribution of a file. Subsequently, refer to a reference table, so as to determine the memory storage space to which the file corresponds.

The above-mentioned summary as well as subsequent descriptions and appended drawings are all for further illustrating the measures, means and effects taken by the present invention to achieve the prescribed objectives. Other goals and advantages of the present invention will be explained in details in the following descriptions and drawings.

BRIEF DESCRIPTION OF THE DRAWINGS

FIG. 4 shows a diagram of the low density memory storage space and the high density storage space illustrated in FIG. 3;

DETAILED DESCRIPTION OF THE PREFERRED EMBODIMENTS

The present invention proposes a memory system having hybrid density memory and relevant methods for wear-leveling management and file distribution management thereof. Said hybrid density memory is collectively configured with both low density memory fabricated by Single-Level-Cell manufacture process as well as high density memory fabricated by Multi-Level-Cell manufacture process. Herein, the low density memory is characterized in lower storage capacity, higher endurance count and faster access rate; whereas the high density memory is in higher storage capacity, less endurance count and lower access rate. The present invention employs two major means, which are memory wear-leveling management and file distribution management, to enable full exploitation of storage performance in hybrid density memory, and also to optimize the application efficiency thereof.

Above all, two solutions are proposed for wear-leveling management of hybrid density memory. In a non-volatile memory system, each effective block can be repeatedly used for data storage and erase. Since the erase count of a block is limited, to full exploit memory resources, it is possible to control the erase count of block, so as to make each block reach its endurance count limit as simultaneously as possible. Due to the large differences of endurance counts between high density memory and low density memory existing within a memory system consisting of hybrid density memory, the control of erase count in block is thus necessary to collectively take respectively different endurance counts into consideration.

Figure 1A:
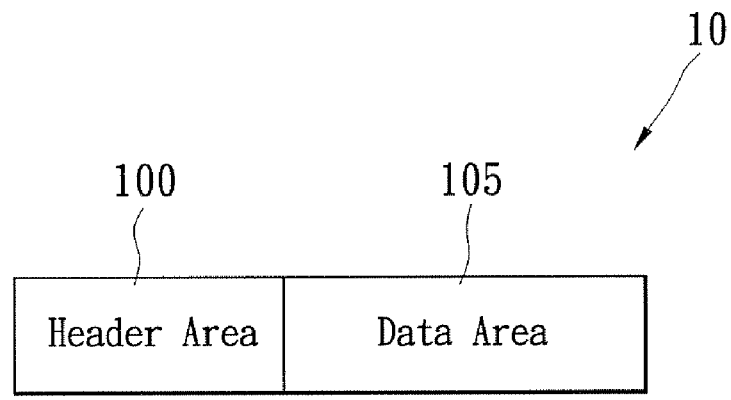
FIGS. 1A and 1B show diagrams of prior art storage management for hybrid density memory.
Figure 1B:
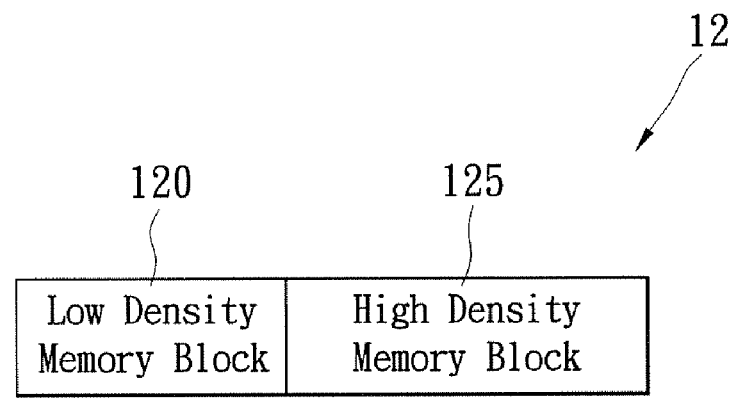
Figure 2:
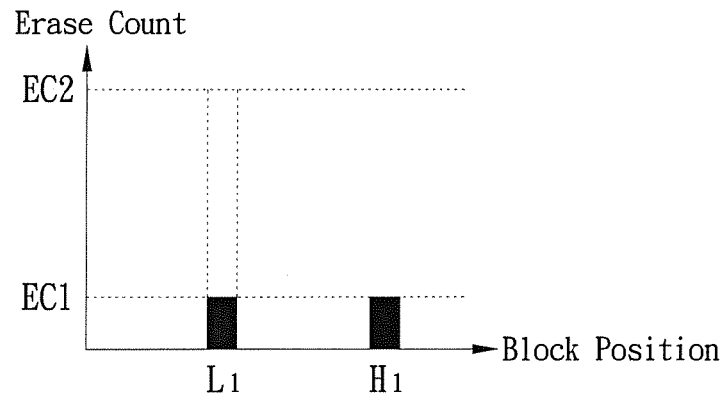
FIG. 2 shows a diagram of prior art erase count.
Figure 3:
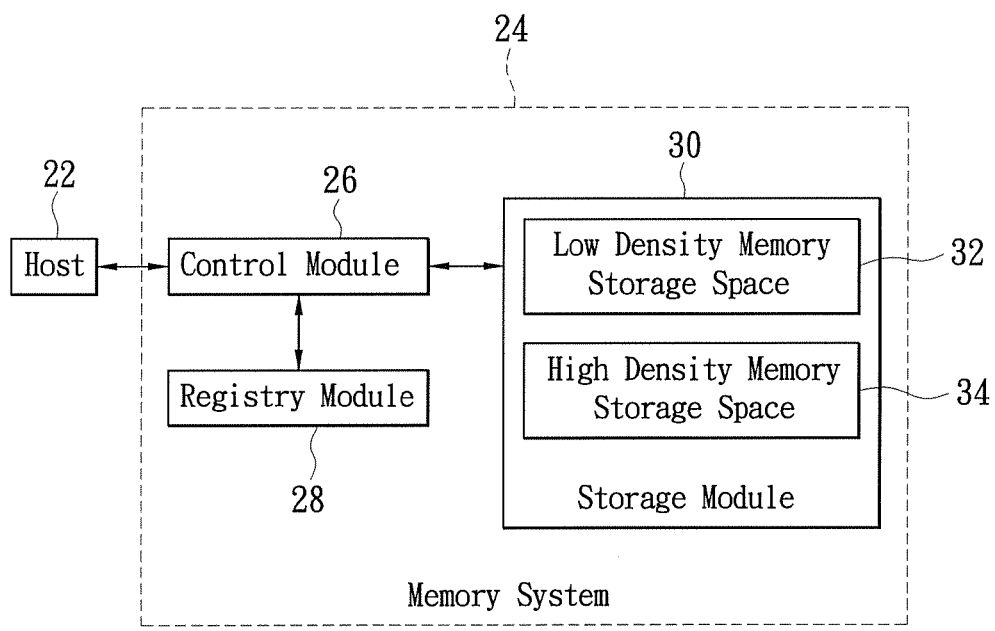
FIG. 3 shows a system architecture diagram of the management system of hybrid density memory according to the present invention.

The first embodiment provided by the present invention is to generate weigh factors based on the ratio of respectively different endurance counts between memory storage spaces, and then accumulate erase count of each block with the erase count adjusted by the generated weighting factors. Referring now again to FIG. 3, wherein a system architecture diagram of the management system 20 for hybrid density memory according to the present invention is shown. As illustrated in FIG. 3, the management system 20 comprises a host 22 and a memory system 24 having hybrid density memory. The host 22 is coupled with the memory system 24, in which the host 22 can be employed as an application system for data access, e.g. a computer, a communication device, a digital device such as digital camera, digital AV player and the like. The memory system 24 is used as a storage unit of the host 22. For example, a memory card, a thumb drive and a hard disk etc.

As shown in FIG. 3, the memory system 24 is coupled with the host 22, and the memory system 24 comprises a control module 26, a registry module 28 and a storage module 30. The registry module 28 consists of random access memory, which is used to hold data temporarily. The storage module 30 consists of non-volatile memory (or referred as electricity-independent memory) formed by flash memory, which is used for data storage. The control module 26 is coupled with the host 22, the registry module 28 and the storage module 30. Furthermore, the host 22 is installed with an operation system and hardware drivers, so as to execute hardware control and data transmission to the memory system 24. The control module 26 may accept control of the data access command from the host 22, perform read/write position reference conversion, and access to the registry module 28 and the storage module 30. The control module 26 controls the erase operation of the storage module 30 based on firmware control, so as to reach the objectives of wear-leveling and erase count reduction.

The storage module 30 is composed of hybrid density memory, which comprises a low density memory storage space 32 and a high density memory storage space 34. The low density memory storage space 32 is manufactured by the Single-Level-Cell (SLC) process and the high density memory storage space 34 is manufactured by the Multi-Level-Cell (MLC) process. The low density memory storage space 32 and the high density memory storage space 34 have respectively different endurance counts.

In view that the prior art U.S. Pat. No. 6,807,106 proposed to store respectively the header area and data area of a file data into the blocks of low density memory and high density memory, which causes early failure of the high density memory block, the present invention thus stores the header area and data area of the file data into the blocks of the same memory storage space, so as to avoid the above-mentioned defect.

Referring now also to FIG. 4, wherein a diagram of the low density memory storage space 32 and the high density memory storage space 34 in FIG. 3 is shown. As illustrated in FIG. 4, the low density memory storage space 32 is configured with a plurality of blocks $L_1 \sim L_M$, the high density memory storage space 34 is configured with a plurality of blocks $H_1 \sim H_N$, where M and N are integers more than 1. Additionally, said low density memory storage space 32 and high density memory storage space 34 may be formed within the same memory chip, or respectively formed by one or more memory chips.

In addition to the storage of user data, the blocks $L_1 \sim L_m$ and $H_1 \sim H_N$ may also be split out a chunk thereof as a block for storing additional information, so as to record relevant hardware description, storage data and erase count of individual blocks. As shown in FIG. 4, the blocks $L_1, \ldots, L_M$ and $H_1, \ldots, H_N$ store respectively individual erase counts $C_{L1}, \ldots, C_{LM}, C_{H1}, \ldots, C_{HN}$. When the host 22 is initialized, stores file data, or is assigned to perform wear-leveling management, the control module 26 reads the individual erase counts $C_{L1}, \ldots, C_{LM}, C_{H1}, \ldots, C_{HN}$ for each block $L_1, \ldots, L_M$ and $H_1, \ldots, H_N$ to acquire the erase count of each block, so as to employ these blocks according to the erase counts of the blocks, thus achieving the objective of wear-leveling.

Here the erase process of a block and record mechanism of erase count in the block will be described. Taking the block $L_1$ as an example, when the control module 26 receives a command from the host 22, or the firmware is enabled, to execute an erase action on block $L_I$, the control module 26 will read the erase count $C_{L1}$, and, after the completion of the erase action on block $L_1$ by the control module 26, the accumulated erase count CL1 will be written back to the block $L_1$.

Since the low density memory storage space 32 and the high density memory storage space 34 have different endurance counts, in case that the accumulation is based on the erase count with fidelity, the erase counts $C_{L1}, \ldots, C_{LM}, C_{H1}, \ldots, C_{HN}$ will reflect the accumulated erase counts ever performed on the blocks $L_1, \ldots, L_M, H_1, \ldots, H_N$. When the control module 26 performs wear-leveling control, it will increase the use ratio over the blocks with less erase counts, such that the erase count for each block may be consistent as much as possible. As a result, the blocks $H_1, \ldots, H_N$ in the high density memory storage space 34 with less endurance counts will inevitably encounter the problem of early failure.

Therefore, the present invention generates an individual erase count weighting factor for each memory storage space based on the inverse of the ratio of endurance counts of memory storage spaces. When the control module 26 writes the erase count back to a block, it accumulates the erase count based on the weighting factor of the memory storage space to which the block belongs. In other word, the individual erase counts $C_{L1}, \ldots, C_{LM}, C_{H1}, \ldots, C_{HN}$ of the blocks $L_1, \ldots, L_M, H_1, \ldots, H_N$ are not the actual erase counts, but the effectively equivalent erase counts adjusted by the weighting factors, so as to reflect the effective life span thereof. Hence, it is possible to perform wear-leveling management according to the consumed life span ratio of the blocks, instead of performing wear-leveling control merely based on the erase counts.

Here the mechanism described supra may be further explained with an instance. Assuming that the endurance counts for the low density memory storage space 32 and the high density memory storage space 34 in FIG. 3 are respectively 100,000 times and 10,000 times, whose ratio is 10:1. It is possible to, based on the inverse of the endurance count ratio, 1:10, determine the respective erase count weighting factor for the low density memory storage space 32 and the high density memory storage space 34. For example, it may respectively define the weighting factors of the low density memory storage space 32 and the high density memory storage space 34 to be 1 and 10. Then, as accumulating the erase counts of blocks $L_1$~$L_M$ of the low density memory storage space 32, the erase counts will add an increment of 1; whereas as accumulating the erase counts of blocks $H_1$~$H_N$ of the high density memory storage space 34, the erase counts will add an increment of 10. In this way, the erase counts of the blocks $H_1$~$H_N$ will rise up in a faster rate, the control module 26 will thus decrease the use ratio of the blocks $H_1$~$H_N$ in the high density memory storage space 34, so as to prevent the blocks $H_1$~$H_N$ from early failure due to sooner encounter of the endurance count restriction thereof.

Figure 5:
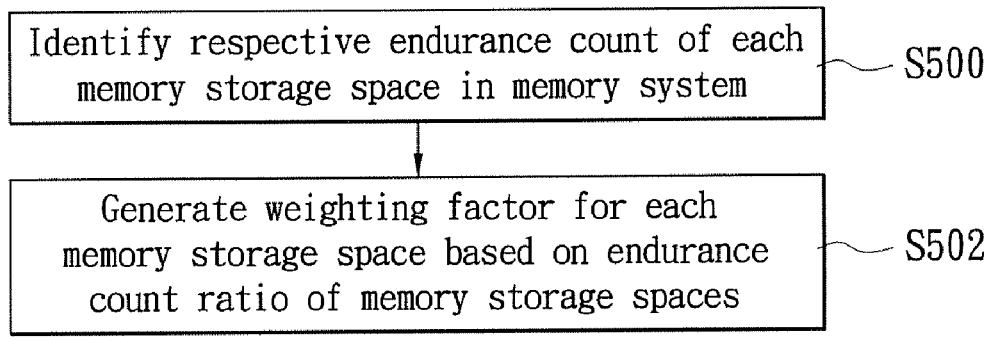
FIG. 5 shows a step-wise flowchart of the method for generating weighting factors according to the present invention.

Hereunder a first embodiment of the method for wear-leveling management according to the present invention is illustrated in detail. Referring now to FIG. 5, a step-wise flowchart of the method for generating weighting factors of memory storage space is shown. Said weighting factor generating method can be used to generate the individual weighting factor for the memory storage space, facilitating the management system 20 to perform wear-leveling management. As shown in FIG. 5, said weighting factor generating method comprises the subsequent steps:

Initially, the control module 26 identifies the respective endurance count of each memory storage space in the memory system 24 (step S500); and Next, based on the endurance count ratio of the memory storage spaces, it generates the weighting factor for each memory storage space, such that the ratio of weighting factors for the memory storage spaces is inverse to the ratio of endurance counts in memory storage space (step S502).

In one embodiment, the weighting factors generated in step S502 are recorded in a block inside the storage module 30, and as the host 22 operates, they can be accessed by the control module 26 from the storage module 30 to the registry module 28 for storage, so as to facilitate the calculation and access processes for wear-leveling management performed by the control module 26.

Figure 6:
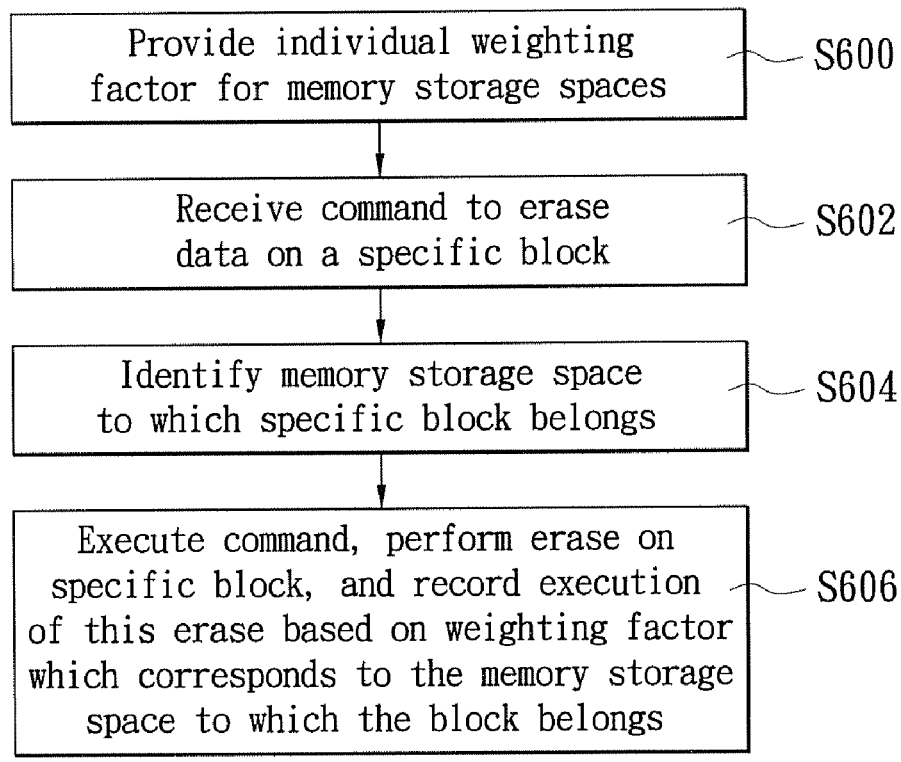
FIG. 6 shows a step-wise flowchart of a first embodiment of the method of wear-leveling management for hybrid density memory according to the present invention.

Subsequently, refer now to FIG. 6, wherein a step-wise flowchart of the first embodiment of the method for wear-leveling management of hybrid density memory according to the present invention is shown. Herein the relevant system architecture thereof may be referred to FIG. 3. As illustrated in FIG. 6, the method comprises the following steps:

Initially, an individual weighting factor is provided for each memory storage space, in which the ratio of weighting factors for these memory storage spaces is inverse to the ratio of endurance counts in these memory storage spaces (step S600);

Next, the control module 26 receives a command to erase data on a specific block (step S602);

Subsequently, the control module 26 identifies the memory storage space to which the specific block belongs (step S604); and Finally, execute the command, perform erase on the specific block, and record the erasing based on the weighting factor which corresponds to the memory storage space to which the block belongs (step S606).

Herein the step S600 is generated in accordance with the above-disclosed weighting factor generating method.

In one embodiment, each block stores respective erase count. In step S606, when the control module 26 executes the command to erase data on a specific block, it comprises the following steps:

First of all, read the erase count of the specific block;

Then, erase the data stored in the specific block;

Subsequently, accumulate the erase count based on the weighting factor which corresponds to the memory storage space to which the block belongs; and At last, write the accumulated erase count in the specific block.

Besides, in FIG. 3, it takes a high density memory storage space 34 as an example, whereas the storage module 30 may further comprise an additional high density memory storage space having another endurance count. For instance, if the storage module 30 comprises another high density memory storage space with endurance count of 1000, then endurance count ratio of the low density memory storage space 32, the high density memory storage space 34 and said another high density memory storage space is 100:10:1. Accordingly, it is possible to infer that the weighting factor ratio for these three memory storage spaces is the inverse value of 100:10:1, i.e. 1:10:100. Based on the above-mentioned weighting factor ratio, the weighting factor for each memory storage space can be defined. Furthermore, said weighting factors may be acceptable as long as they match the requirement of weighting factor ratio; that is, it is possible to arbitrarily define the weighting factors of these three memory storage space as 1, 10, 100 or as 10, 100, 1000.

Collaterally, in another embodiment, the weighting factor ratio of the memory storage spaces is not necessarily the inverse to the ratio of the endurance counts of these memory storage spaces. For example, in FIG. 3, it is possible to respectively assign a weighting factor to the low density memory storage space 32 and the high density memory storage space 34, such that the weighting factor of the high density memory storage space 34 is greater than the one of the low density memory storage space 32. In this way, the erase counts of the blocks in the high density memory storage space 34 may rise up faster.

The first embodiment achieves the objective of wear-leveling by comparing erase count of each block. However, this solution needs to access every block to acquire the erase count of each block. Such a procedure not only consumes system resources, but causes latency in data process. Hence, the inventors of the present invention propose a second embodiment as below.

In a second embodiment of the present invention, upon reception of a data storage command, it generates a sampling table based on the endurance count ratio of the memory storage spaces, wherein the generated table is formed by the block positions corresponding to said endurance counts. As the host 22 issues a data storage demand to the control module 26, the control module 26 accordingly generates a sampling table, and selects at least one block position in the sampling table to respond to the data storage command for data storage. The number of block positions that each memory storage space distributed in the sampling table has is proportional to the endurance count of the block. For example, in the storage module 30, if the endurance count ratio of the low density memory storage space 32 and the high density memory storage space 34 is 10:1, then the sample composition ratio in the sampling table may be prescribed as ten block positions of the low density memory storage space 32 and one block position of the high density memory storage space 34. In this way, the control module 26 can generate the sampling table according to the prescribed ratio of number of samples, and then select randomly the sample therein to determine the data storage position.

Figure 7:
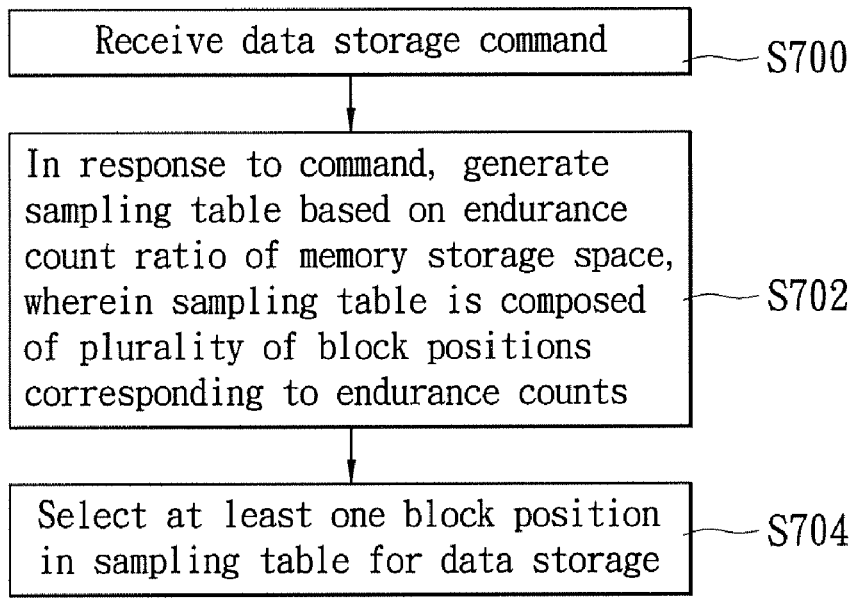
FIG. 7 shows a step-wise flowchart of a second embodiment of the method of wear-leveling management for hybrid density memory according to the present invention.

Referring now to FIG. 7, a step-wise flowchart of the first embodiment of the method for wear-leveling management of hybrid density memory according to the present invention is shown, wherein the relevant system architecture thereof may be referred to FIG. 3. As illustrated in FIG. 7, the method comprises the following steps:

Initially, the control module 26 receives a data storage command (step S700);

Next, in response to the command, generate a sampling table based on the endurance count ratio of the memory storage space, in which the sampling table is composed of the plurality of block positions corresponding to the endurance counts (step S702); and Finally, select at least one block position in the sampling table, and respond to the data storage command for data storage according to the selected block position (step S704).

Herein, the number of block positions that each memory storage space distributed in the sampling table has is proportional to the endurance count of the memory storage space.

In this way, it is possible to achieve the objective of wear-leveling for averaged use of each block by means of uneven distribution and random selection on number of samples.

Furthermore, for practical applications, since the capacities of blocks in memory storage space are different, in one embodiment, the number of block positions for each memory storage space distributed in the sampling table is further proportional to the block capacity of the memory storage space, such that the samples of the reference table may distributed in accordance with the memory capacity of the memory system 24, so as to more accurately achieve the purpose of wear-leveling.

The first and second embodiments described supra use the endurance count ratio of memory to perform wear-leveling management on hybrid density memory. In view that, for practical applications, file data presents different characteristics, demands for storage features of memory may thus also vary distinctively. In hybrid density memory, high density memory provides storage space of high capacity, whereas the storage space that low density memory, though, offers is less, it does allow higher access performance and reliability. Therefore, for files requiring high storage capacity with less modification, such as execution files, audio/video files, they may be stored in the high density memory storage space. Contrarily, for those files frequently accessed, modified and crucially related with the running of the operating system, e.g. files system, page files and cache files, they require higher data access rate and reliability, and may be stored in the low density memory storage space.

Figure 8:
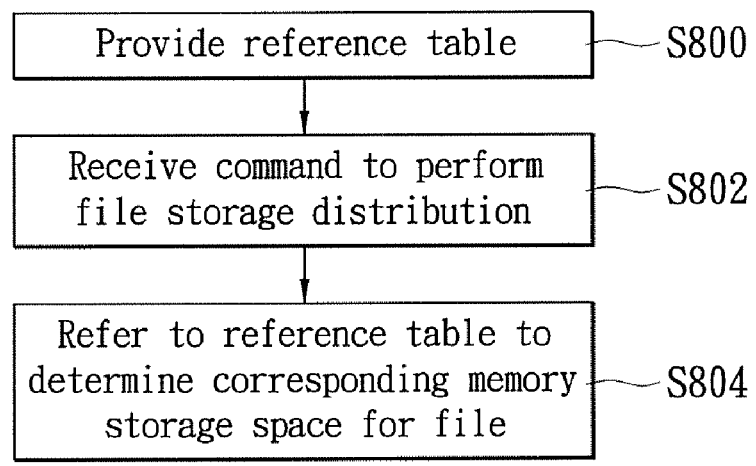
FIG. 8 shows a step-wise flowchart of the method of file distribution management for hybrid density memory according to the present invention.

The method of file distribution management according to the present invention stores file data in the memory matching the operation characteristics thereof based on logical view of point, so as to further optimize the performance of hybrid density memory. In FIG. 3, the storage module 30 holds a file system, which system may be based on the system architecture specified in the file system FAT12, FAT16, FAT32 or NTFS, in order to manage the file data stored in the storage module 30. The corresponding relationship between logical address and physical address of the file data is mapping conversed via logical block addressing. Referring now to FIG. 8, a step-wise flowchart of the method for file distribution management according to the present invention is shown. As illustrated in FIG. 8, said method for file distribution management comprises the following steps:

First, provide a reference table (step S800);

Next, receive a command to perform a file storage distribution (step S802); and Finally, refer to the reference table, and determine the corresponding memory storage space for the file based on the characteristics thereof (step S804).

Said reference table records the memory storage space to which the file characteristics correspond. Said file characteristics may be file type; for example, to list the corresponding memory storage spaces according to the extension names of file data, so as to distribute the files system, page files and cache files requiring higher storage performance to the low density memory storage space 32 for storage, and distribute the audio/video files and execution files requiring higher storage capacity with less data modification to the high density memory storage space 34 for storage. Said file characteristics may be the frequency of file operation (file access frequency) as well, and the corresponding memory storage space can be determined by means of detecting the frequencies of file operations like open, update and storage, so as to distribute the frequently modified or accessed files to the low density memory storage space 32 for storage, and distribute less modified or access files to the high density memory storage space 34 for storage. Said may be also filename or file fold directory, in which the file data can be distributed to the memory storage space scheduled in the reference table according to the filename or the file fold directory of the file.

In an embodiment, said reference table is generated by executing a file management program. After the generation of the reference table by said file management program, it will store the reference table to a prescribed position in the storage module 30, and as the host 22 starts, the control module 26 accesses the stored reference table from the storage module 30 to the registry module 28 for temporary storage, facilitating access to the reference table at any moment during file distribution, so as to refer to the prescribed physical position of the file.

Figure 9:
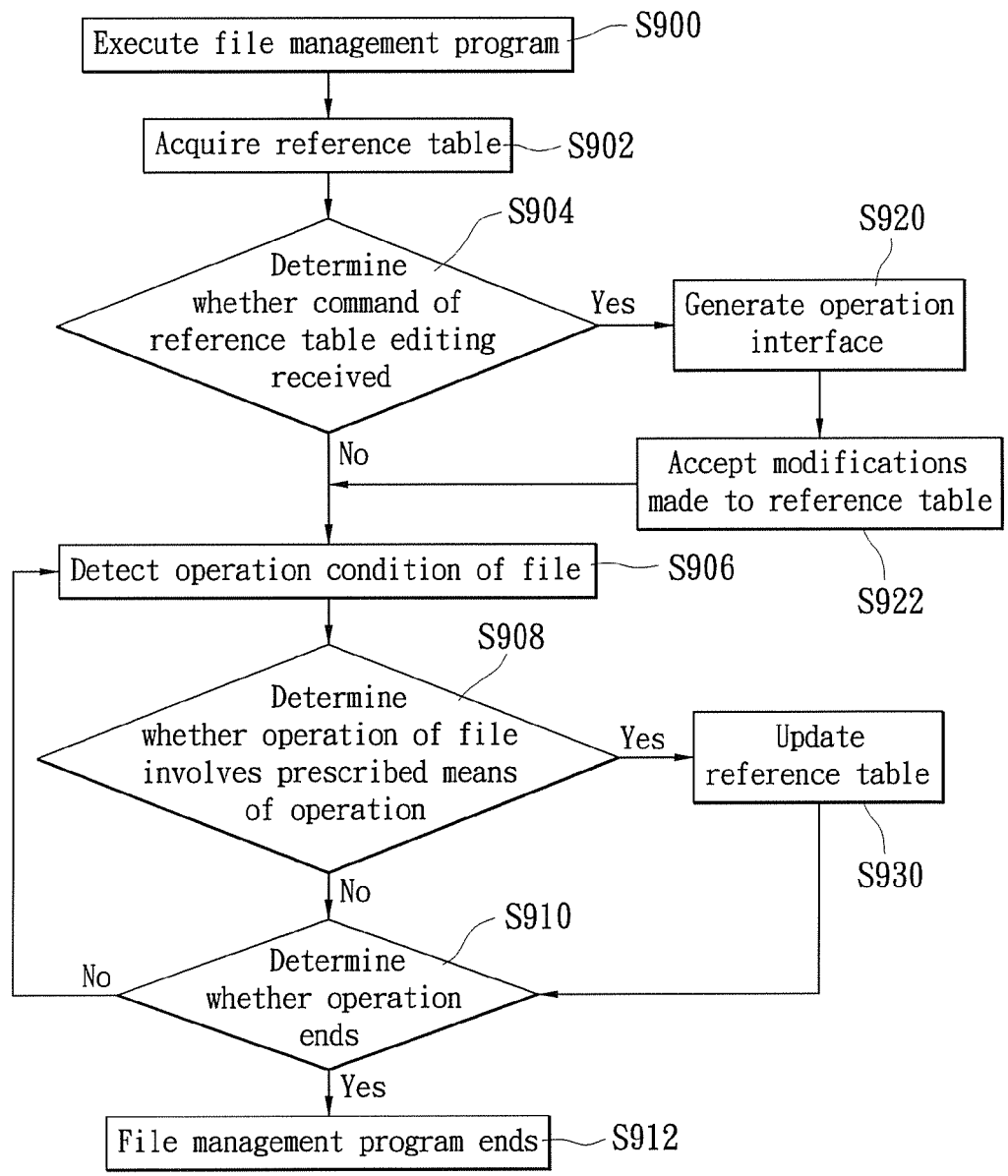
FIG. 9 shows a step-wise flowchart of the method for editing the reference table according to the present invention.

In one embodiment, the reference table is edited by the file management program. Furthermore, based on the execution of the file management program, it is possible to automatically detect the file characteristics by the system to edit the reference table; or the user may edit the reference table to directly control the memory system. Hence, the ways to edit the reference table comprise user's edit and control mode as well as automatic program detection and control mode. Referring now to FIG. 9, a step-wise flowchart of the method for editing reference table according to the present invention is shown. As illustrated in FIG. 9, the method comprises the following steps:

First, execute the file management program (step S900);

Next, based on the execution of the file management program, initialize various settings of the file management program and acquire the reference table (step S902);

Then determine whether the reference edit command is received, in which the reference table edit command indicates the user intends to actively edit the reference table (step S904);

If the determination in step S904 indicates the reference table edit command is received, then enter the user edit management mode, and the host 22 controls the display to generate an operation interface for editing the reference table (step S920);

Subsequently, accept the modifications to the reference table (step S922);

In case the determination in step S904 indicates the reference table edit command is not received, then enter automatic program detection management, to detect the operating conditions of the file in background operation mode (step S906);

Subsequently, determine whether the operation of the file involves a prescribed means of operation, e.g. file open, update and storage (step S908);

If the determination in step S908 indicates the operation of the file involves a prescribed means of operation, then update the contents of the reference table. For example, based on the prescribed schedule in the reference table, assuming that a file originally distributed to the high density memory storage space 34 has now been detected to be opened, modified and stored, then the file management program updates the contents of the reference table according to the detection, switching the memory storage space which the file corresponds to from the high density memory storage space 34 to the low density memory storage space 32 (step S930);

In case the determination in step S908 indicates no, then determine whether the operation ends (step S910);

If the determination in step S910 indicates no, then return to step S906 and carry on the file operation detection;

If the determination in step S910 indicates the operation ends, then terminate the execution of the file management program (step S912).

It is particularly noted that the timings for executing the file distribution program are not limited to the moments of file storage and file operation. The file distribution management may be executed whenever the host 22 starts or file access is performed. Besides, since, for file distribution management, it is required to perform procedures like file character identification and reference to the reference table etc., which consumes more system resources, the file distribution management according to the present invention needs not to identify characteristics of all files in the file system to determine the memory storage spaces for all files. In one embodiment, it is directed to execute file distribution management on files with high importance, such as file system, cache files and paging files, so as to store said types of files in the low density memory storage space providing better reliance and access performance.

By means of the above detailed descriptions, it is appreciated that the memory system having hybrid density memory and methods for relevant wear-leveling management and file distribution management thereof according to the present invention provide an effective solution of control and management for the applications of hybrid density memory. Herein, the first embodiment for said method of wear-leveling management generates weighting factors based on the endurance count ratio of memory storage spaces in hybrid density memory, so as to adjust individual accumulated erase count of block. The second embodiment of the method for wear-leveling management is to select a block by generating a reference table to match the block, such that the blocks which belong to different memory storage spaces may reach the limits of endurance counts as simultaneously as possible. The method of file distribution management is to determine a block for a file by referring to a reference table, such that the file may be stored in a suitable memory storage space, thus enhancing the storage performance of hybrid density memory. As a result, the present invention provides a practical and usable mechanism for improving several defects found in prior art hybrid density memory applications to optimize the utilities thereof.

The above-mentioned illustrations present simply the detailed descriptions and drawings of the embodiments of the present invention, without any intention to restrict the scope of the present invention thereto. The entire scope of the present invention should be based on the subsequent claims; all changes, substitutions or modifications that persons skilled in the art can easily consider and fabricate are encompassed in the scope of the present invention delineated by the following claims.

What is claimed is:

1. A method of wear-leveling management for hybrid density memory, which is suitable for controlling a memory system, wherein the memory system comprises a plurality of memory storage spaces having a plurality of blocks, the memory storage spaces respectively are associated with different initial endurance counts, and each of the blocks in the memory storage space is subject to the initial endurance count associated with the memory storage space, the method of wear-leveling management comprising:

receiving a data storage command;

generating a sampling table in response to the data storage command, wherein the sampling table records a plurality of block positions, wherein each of the block positions corresponds to one of the blocks, with numbers of the recorded block positions being positively proportional to ratios of the initial endurance counts of the memory storage spaces; and randomly selecting at least one block position contained in the sampling table, so as to store the data to the blocks corresponding to the selected block position.

2. The method of wear-leveling management according to claim 1, wherein the memory storage spaces comprise at least a low density memory storage space and at least a high density memory storage space.

3. The method of wear-leveling management according to claim 1, wherein the numbers of the block positions in the sampling table further depend on a storage capacity of the corresponding memory storage spaces.

* * * * *